US009185659B2

(12) United States Patent
Patel et al.

(10) Patent No.: US 9,185,659 B2
(45) Date of Patent: Nov. 10, 2015

(54) TWO-DIMENSIONAL TRANSMIT POWER COMPENSATION

(71) Applicant: QUALCOMM Incorporated, San Diego, CA (US)

(72) Inventors: Shrenik Patel, San Diego, CA (US); Orhan C Ozdural, San Diego, CA (US); Wei-Hao Lin, San Diego, CA (US); Pritesh Vora, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 158 days.

(21) Appl. No.: 13/952,902

(22) Filed: Jul. 29, 2013

(65) Prior Publication Data

US 2014/0119216 A1    May 1, 2014

Related U.S. Application Data

(60) Provisional application No. 61/718,583, filed on Oct. 25, 2012.

(51) Int. Cl.
*H04B 7/185* (2006.01)
*H04W 52/24* (2009.01)
*H03G 3/30* (2006.01)
*H04B 17/19* (2015.01)

(52) U.S. Cl.
CPC ............. *H04W 52/24* (2013.01); *H03G 3/3042* (2013.01); *H04B 17/19* (2015.01)

(58) Field of Classification Search
None
See application file for complete search history.

(56) References Cited

U.S. PATENT DOCUMENTS

| | | | |
|---|---|---|---|
| 2003/0002452 A1* | 1/2003 | Sahota | 370/318 |
| 2011/0086600 A1* | 4/2011 | Muhammad | 455/120 |
| 2011/0105061 A1 | 5/2011 | Yu et al. | |
| 2011/0222621 A1* | 9/2011 | Christensen et al. | 375/271 |
| 2012/0013410 A1 | 1/2012 | Rebel et al. | |
| 2012/0069871 A1 | 3/2012 | Bickerstaff et al. | |
| 2012/0135697 A1* | 5/2012 | Park et al. | 455/127.2 |
| 2012/0196546 A1 | 8/2012 | Ly-Gagnon | |
| 2013/0012141 A1 | 1/2013 | Harnishfeger | |

FOREIGN PATENT DOCUMENTS

WO    2004004176 A1    1/2004

OTHER PUBLICATIONS

International Search Report and Written Opinion—PCT/US2013/066710—ISA/EPO—Oct. 23, 2013.

(Continued)

*Primary Examiner* — Duc C Ho

(57) ABSTRACT

Exemplary embodiments are related to two-dimensional maximum power compensation. A method may include calibrating an output power level of a transmitter across a range of frequencies at a constant temperature. The method may further include characterizing the output power level of the transmitter for each temperature of a plurality of temperatures for each frequency of the range of frequencies.

23 Claims, 5 Drawing Sheets

(56) References Cited

OTHER PUBLICATIONS

"3rd Generation Partnership Project; Technical Specification Group Radio Access Network; Evolved Universal Terrestrial Radio Access (E-UTRA); TDD Home eNode B (HeNB) Radio Frequency (RF) requirements analysis (Release 10)", 3GPP Standard; 3GPP TR 36.922, 3rd Generation Partnership Project (3GPP), Mobile Competence Centre ; 650, Route Deslucioles ; F-06921 Sophia-Antipolis Cedex; France, no. VIO.0.0, Apr. 12, 2011, pp. 1-74, XP050477566,[retrieved on Apr. 12, 2011] chapter 6.4.21-70.
Product Data Sheet, "BLM6G22-30; BLM6G22-30G W-CDMA 2100 MHz to 2200 MHz power MMIC," Rev. 4-7 Mar. 2011, NXP Semiconductors, pp. 1-14.

* cited by examiner

TWO-DIMENSIONAL TRANSMIT POWER COMPENSATION

CLAIM OF PRIORITY UNDER 35 U.S.C. §119

The present application for patent claims priority to Provisional Application No. 61/718,583, filed Oct. 25, 2012, and assigned to the assignee hereof and hereby expressly incorporated by reference herein.

BACKGROUND

1. Field

The present invention relates generally to transmit power of a wireless communication device. More specifically, the present invention relates to embodiments for two-dimensional power compensation for improving maximum transmit power level accuracy of wireless communication devices.

2. Background

Wireless communication systems are widely deployed to provide various telecommunication services such as telephony, video, data, messaging, and broadcasts. Conventional wireless communication systems may employ multiple-access technologies capable of supporting communication with multiple users by sharing available system resources (e.g., bandwidth, transmit power). Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency divisional multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example of an emerging telecommunication standard is Long Term Evolution (LTE). LTE is a set of enhancements to the Universal Mobile Telecommunications System (UMTS) mobile standard promulgated by Third Generation Partnership Project (3GPP). It is designed to better support mobile broadband Internet access by improving spectral efficiency, lower costs, improve services, make use of new spectrum, and better integrate with other open standards using OFDMA on the downlink (DL), SC-FDMA on the uplink (UL), and multiple-input multiple-output (MIMO) antenna technology. As the demand for mobile broadband access continues to increase, there exists a need for further improvements in LTE technology. Preferably, these improvements should be applicable to other multi-access technologies and the telecommunication standards that employ these technologies.

A need exists for improving accuracy of maximum transmit power of wireless communication devices. More specifically, a need exists for embodiments related to improving accuracy of maximum transmit power of wireless communication devices via two-dimensional power characterization.

DETAILED DESCRIPTION

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

As will be appreciated by a person having ordinary skill in the art, accurate control of transmit power is essential in modern wireless communications to conserve power and mitigate adjacent interference. Transmit power, which may adjusted using feedback commands that direct a transmitter to increase or decrease power in incremental steps, may have an upper limit (i.e., a maximum power) to prevent runaway interference and user equipment (UE) failure. In conventional wireless standards such as 3GPP, the maximum power was required to be accurate to within +/−2.0 dB. However, such a loose specification is undesirable in high bandwidth standards such as long-term evolution (LTE). Compared to other technologies, LTE may be more challenging due to the single resource block (RB) allocations at the band edge. A single RB in LTE is only 180 kHz wide.

Single RB allocations at a band edge experience the effect of front-end (FE) components increasing or decreasing insertion loss with temperature. Most UE designs have a feedback path through a directional coupler where a fraction of the output power is fed back to circuitry in the UE to accurately track the output power. In many designs, the coupler is placed at a power amplifier (PA) output, which prevents the coupler from seeing the effect of transmitter front-end (FE) components that are located after the PA (e.g., duplexer and post-PA band pass filters (BPFs)).

Accordingly, original equipment manufacturers (OEMs) highly desire tighter and more predicable tolerances on the order of +/−0.5 dB for maximum power across all channels, all bands, and all RBs across a band. It has been observed that UE LTE maximum power for different RB allocations and channels fails maximum power accuracy requirements over temperature, especially for bands with steep FE roll-off near band edges.

Figure 1:
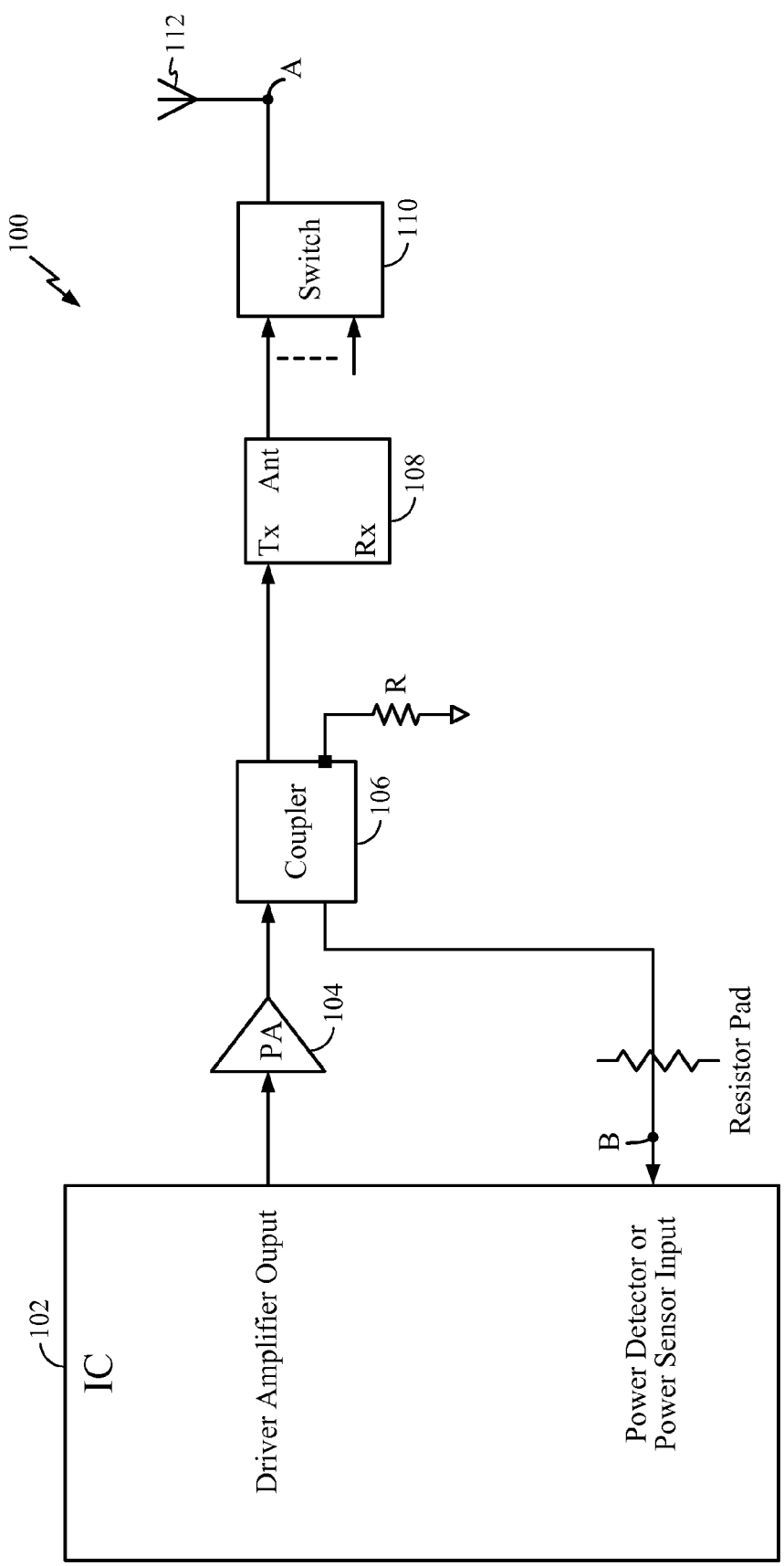
FIG. 1 illustrates a device including an integrated circuit coupled to a power amplifier of a transmit path.

FIG. 1 illustrates a device 100 including an integrated circuit 102 coupled to a power amplifier (PA) 104 in a transmit path of a transmitter. PA 104 is further coupled to a coupler 106, which is coupled to integrated circuit 102 via a feedback path. By way of example, coupler 106 may be coupled to a power detector (i.e., a power sensor) of integrated circuit 102. Coupler 106 is also coupled to a device 108, which may comprise, for example, a duplexer (DPX) filter for frequency division duplex (FDD) systems or a bandpass filter (BPF) for time division duplex (TDD) systems. Device 108 may be further coupled to an antenna 112 via a switch 110. As will be appreciated by a person having ordinary skill in the art, because coupler 106 is positioned at an output of PA 104, coupler 106 does not detect the effect of device 108 or any other components (i.e., the transmitter FE components), which are positioned between coupler 106 and antenna 112.

A transmit power loop of a wireless communication device may be compensated as a function of temperature alone. Although, this may be sufficient for uplink allocations in a middle of a band, at hot and cold temperature extremes, and for narrow RB allocations, a duplexer or post-PA filter (e.g., device 108) may generate losses that shift over temperature and, thus, the compensation value for that temperature is not representative of the compensation required to maintain a reliable maximum power tolerance. This may be particularly true when the coupling path for the power detector is before the duplexer or the post-PA filter.

Figure 2:
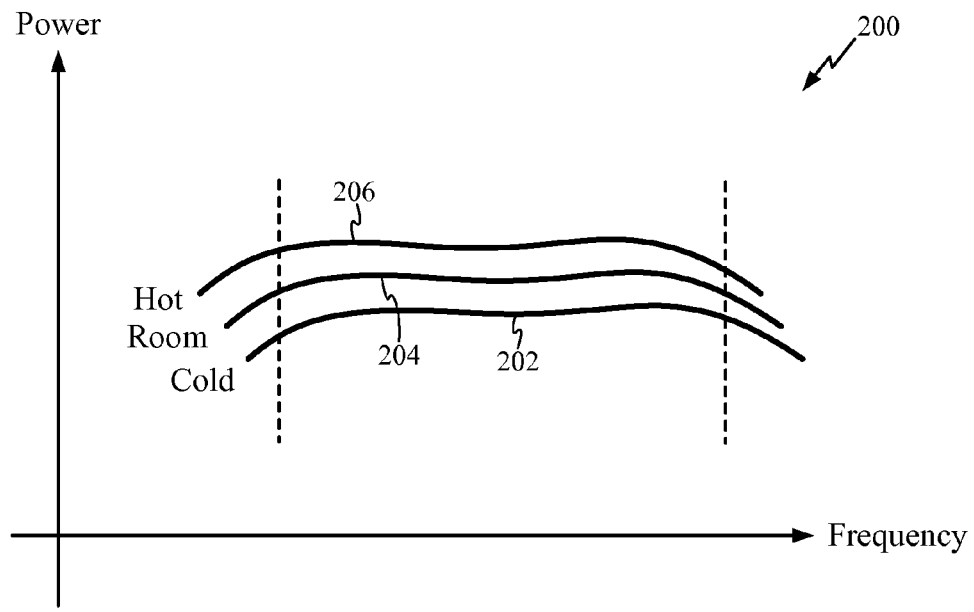
FIG. 2 is a plot depicting transmit power levels during various temperature conditions and across a range of frequencies.

FIG. 2 is a plot 200 illustrating transmit signal power levels across a range of frequencies for different temperatures. More specifically, signal 202 represents a transmit signal power level across a range of frequencies for a "Cold" temperature. Signal 204 represents a transmit signal power level across the range of frequencies for a "Room" temperature. Further, signal 206 represents a transmit signal power level across the range of frequencies for a "Hot" temperature.

A user-equipment (UE) may be compensated for maximum power across frequency via a one-dimensional sweep across a frequency range to determine the maximum power compensation to apply. Further, the UE may be compensated for maximum power across temperature by doing a characterization across a range of temperatures to determine the maximum power compensation to apply. This temperature compensation is independent of frequency and has found to work reasonably well for 3G technologies. However, as illustrated in a plot 200 of FIG. 2, at the band edges, the differences between signals 202, 204, and 206 changes. Stated another way, a difference between the signals is not consistent, especially at the high band edge. Accordingly, for single RB allocations at a band edge, two separate one-dimensional compensations for frequency and temperature have been found to be inadequate to control the maximum power accuracy.

Conventional solutions may be found in two alternative solutions. First, FE components (e.g., duplexers, post-PA BPFs), which either do not have steep roll-off at band edge or do not shift over temperature may be used. Second, the directional coupler may be positioned at the antenna output resulting in a feedback path that would sense the effect of all FE components. The second solution is not a desirable solution due to the effect on receiver sensitivity, susceptibility to jammers being exposed to the feedback path, risk of emissions from the feedback path, etc. since the coupler is directly exposed to the antenna.

Exemplary embodiments, as described herein, are directed to devices and methods for regulating maximum output transmit power of a wireless transmitter. According to one exemplary embodiment, a device may be configured for characterizing maximum transmit power over temperature as a function of frequency. More specifically, for example, a device may include an integrated circuit for conveying a transmit signal. The device may further include a power amplifier coupled to the integrated circuit and configured for conveying the transmit signal to antenna, wherein the integrated circuit is configured to adjust a power level of the transmit signal conveyed by the integrated circuit based on an operating frequency and an operating temperature of the device.

According to another exemplary embodiment, the present invention includes methods for characterizing an output power level of a wireless transmitter. Various embodiments of such a method may include calibrating an output power level of a transmitter across a range of frequencies at a constant temperature, such as a room temperature. The method may further include characterizing the output power level of the transmitter for each temperature of a plurality of temperatures for each frequency of the range of frequencies.

According to another exemplary embodiment, a method may include amplifying a transmit signal within a transmit path of a transmitter operating a known frequency and a known temperature. In addition, the method may include regulating a power level of the transmit signal at an antenna of the transmitter based on the known frequency and the known temperature.

Other aspects, as well as features and advantages of various aspects, of the present invention will become apparent to those of skill in the art though consideration of the ensuing description, the accompanying drawings and the appended claims.

With reference again to FIG. 1, according to one or more exemplary embodiments of the present invention, a power level of an output signal (i.e., at antenna 112) of device 100, which may comprise a transmitter, may be calibrated across a range of frequencies for a single temperature. Furthermore, the power level of the output signal (i.e., at antenna 112), may be characterized in two dimensions (e.g., temperature and frequency). More specifically, during testing, for example at a factory, an output transmit power level of a signal at antenna 112 (i.e., at node A) may be compared to a power level of a signal detected by the power detector (i.e., at node B) of integrated circuit 112 across a range of frequencies (e.g., sixteen frequencies) and at a constant temperature (e.g., a room temperature). Furthermore, the output transmit power level of device 100 (i.e., at node A) may be compared to the power level of the signal detected by the power detector (i.e., at node B) across a range of temperatures (e.g., eight temperatures) for each frequency of the range of frequencies. By comparing the output transmit power level of device 100 to the power level of the signal detected by the power detector across the range of temperatures and the range of frequencies, adjustment power values may be determined These adjustment power values, which may be hard coded within device 100, may then be used during operation to correct a power level conveyed from integrated circuit 102 to ensure that the power level at antenna 112 is accurate. More specifically, for example, if a device, which includes a wireless transmitter, is operating at a known temperature and at a known frequency, then a previously determined power adjustment value corresponding to the known temperature and known frequency may be used to adjust the power level of the signal conveyed to PA 104 from integrated circuit 102. As a more specific example, at a given temperature and a given frequency, a power level at node B may be measured. Based on the calibration done at room temperature across a range of frequencies, a power level at node A may be estimated. The estimated power level at node A may be further adjusted based on the characterization, which is a function of temperature and frequency. Accordingly, the power estimate at node A is improved. Further, based on a desired transmit power level at node A, the power output of integrated circuit 102 may be adjusted appropriately.

Figure 3:
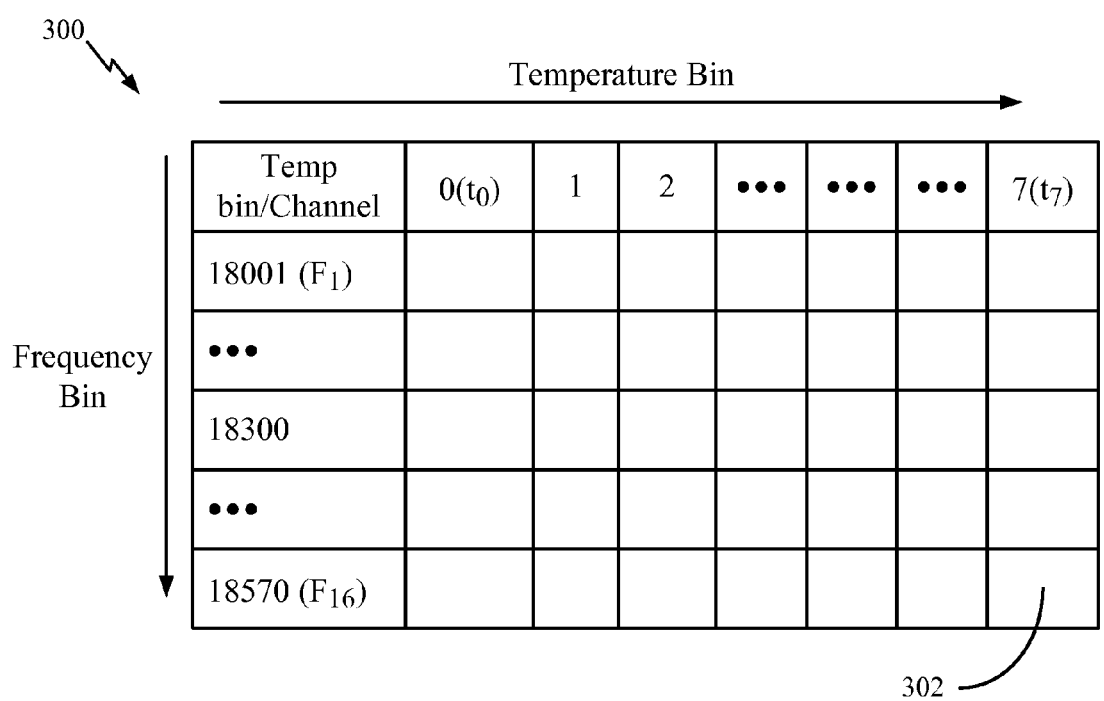
FIG. 3 depicts a two-dimensional matrix including power adjustment values, in accordance with an exemplary embodiment of the present invention.

FIG. 3 depicts a two-dimensional quantized array 300 including power adjustment values, in accordance with an exemplary embodiment of the present invention. As illustrated, array 300 includes a plurality of cells for storing power adjustment values corresponding to a range of frequencies (e.g., sixteen frequencies) and a range of temperature (e.g., eight temperatures). Accordingly, in this illustrated example, 128 adjustment values (i.e., 8*16=128) may be used for the maximum power calibration. It is noted that the adjustment values may be used to adjust a power level of a signal conveyed from integrated circuit 102 to ensure that the power level at antenna 112 is accurate. More specifically, for example, if a device, which includes a wireless transmitter, is operating at temperature $t_7$ and at a frequency $F_{16}$, then a previously determined power adjustment value within a cell 302, which corresponds to temperature $t_7$ and frequency $F_{16}$, may be used to adjust the power level of the signal conveyed to PA 104 from integrated circuit 102. It is noted that although array 300 includes sixteen frequencies and eight temperatures, the present invention is not so limited. Rather, array 300 may be sized to store power adjustment values for any number of frequencies and any number of temperatures.

It is noted that if the power level difference (i.e., power level at B—power level at A) at room temperature as a function of frequency is the same as the power level difference (i.e., power level at B—power level at A) at a second, different temperature (e.g., a "Hot" temperature) as a function of frequency, then the power adjustment value for room temperature may also be used for the second temperature. However, if the power level difference (i.e., power level at B—power level at A) at room temperature as a function of frequency is not the same as the power level difference (i.e., power level at B—power level at A) at the second, different temperature (e.g., a "Hot" temperature) as a function of frequency, then a different power adjustment value for the second temperature may be used.

It is noted that device 100 may be integrated within any electronic communication device, such as a mobile telephone. As a more specific example, device 100 may comprise an LTE transmitter integrated within a wireless communication device. Accordingly, in this example, the two-dimensional compensation over frequency and temperature may be used regulate LTE maximum power over frequency and temperature conditions including RB allocations at a band edge.

Figure 4:
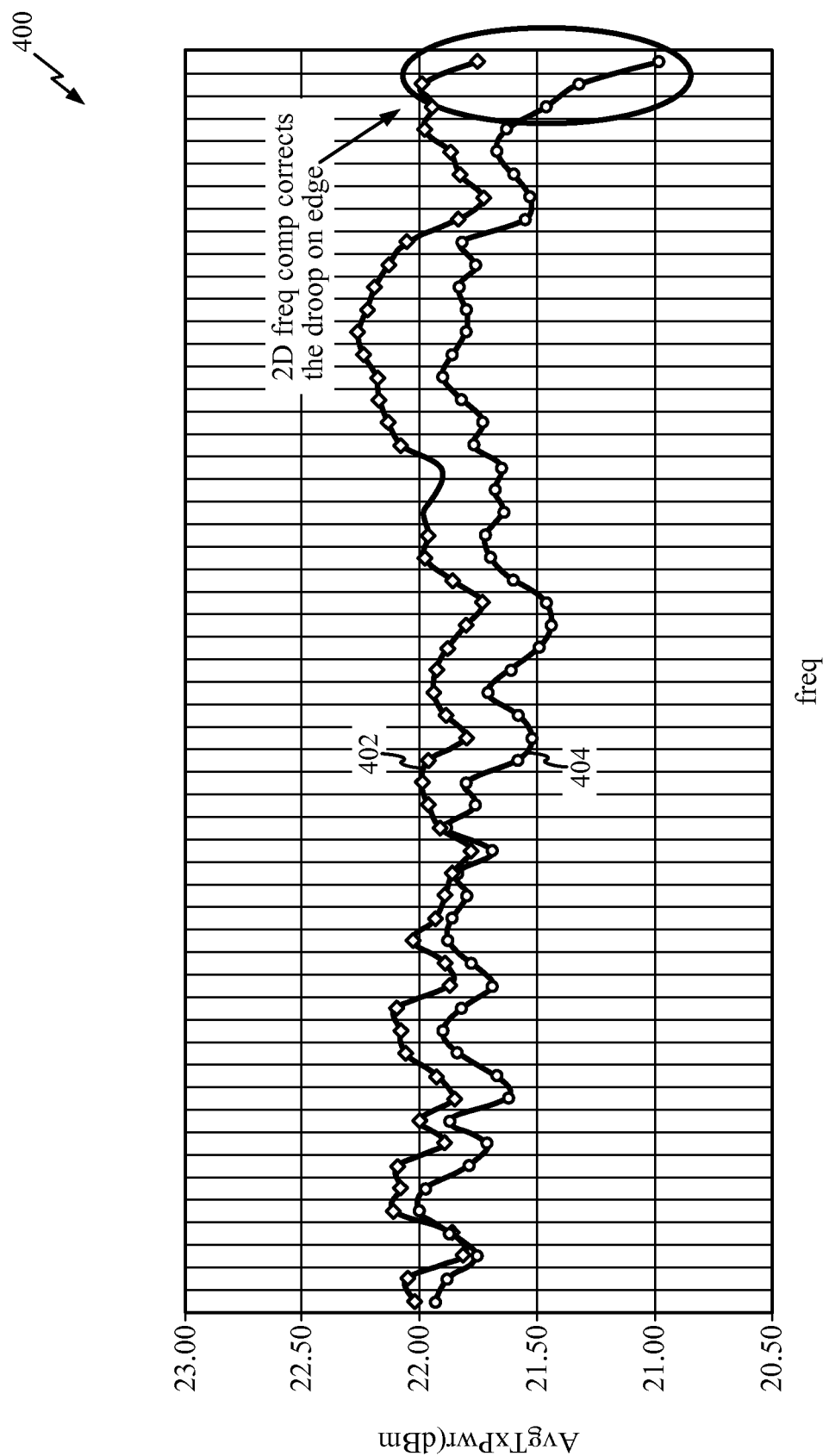
FIG. 4 is a plot comparing average transmit power levels for a two-dimensional compensated transmitter and an uncompensated transmitter

FIG. 4 is a plot 400 depicting a comparison of average transmit power levels for a two-dimensional compensated transmitter and a uncompensated transmitter. More specifically, signal 402 represents an average transmit power level for transmitter at a "Hot" temperature, wherein the transmit power level of the transmitter is compensated via a two-dimensional compensation method, in accordance with one or more exemplary embodiments of the present invention. Further, signal 404 represents an average transmit power level for an uncompensated transmitter at the "Hot" temperature. As illustrated in plot 400, as compared to signal 404, signal 402 does not experience a droop at an edge of plot 400 (i.e., at a band edge) due to the two-dimensional compensation.

Figure 5:
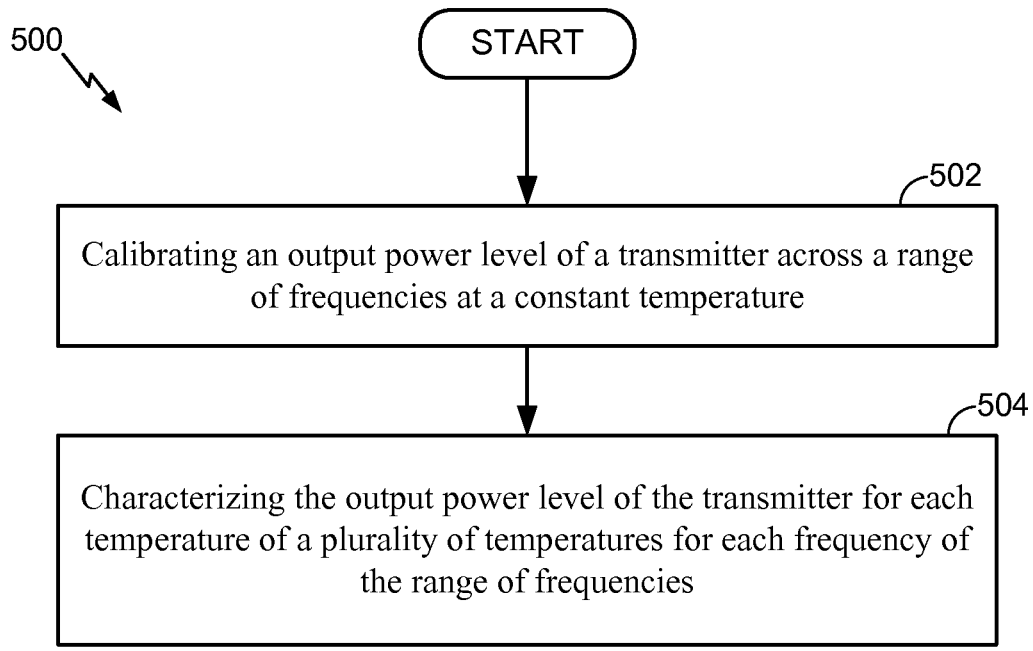
FIG. 5 is a flowchart illustrating a method, according to an exemplary embodiment of the present invention.

FIG. 5 is a flowchart illustrating a method 500, in accordance with one or more exemplary embodiments. Method 500 may include calibrating an output power level of a transmitter across a range of frequencies at a constant temperature (depicted by numeral 502). Method 500 may also include characterizing the output power level of the transmitter for each temperature of a plurality of temperatures for each frequency of the range of frequencies (depicted by numeral 504).

Figure 6:
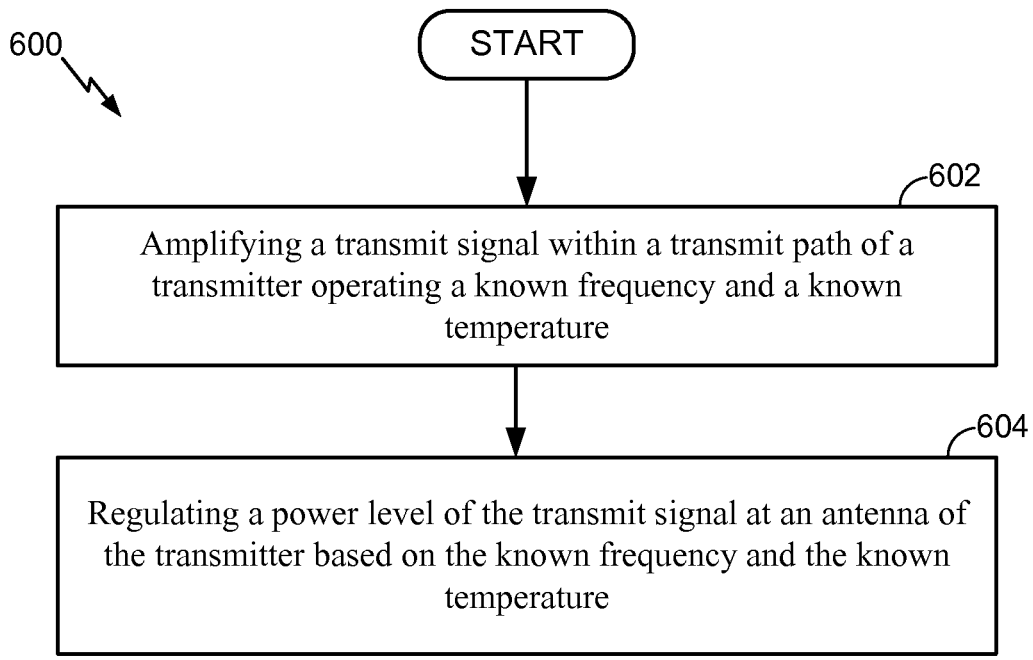
FIG. 6 is a flowchart illustrating another method, according to an exemplary embodiment of the present invention.

FIG. 6 is a flowchart illustrating another method 600, in accordance with one or more exemplary embodiments. Method 600 may include amplifying a transmit signal within a transmit path of a transmitter operating a known frequency and a known temperature (depicted by numeral 602). Method 600 may also include regulating a power level of the transmit signal at an antenna of the transmitter based on the known frequency and the known temperature (depicted by numeral 604).

Figure 7:
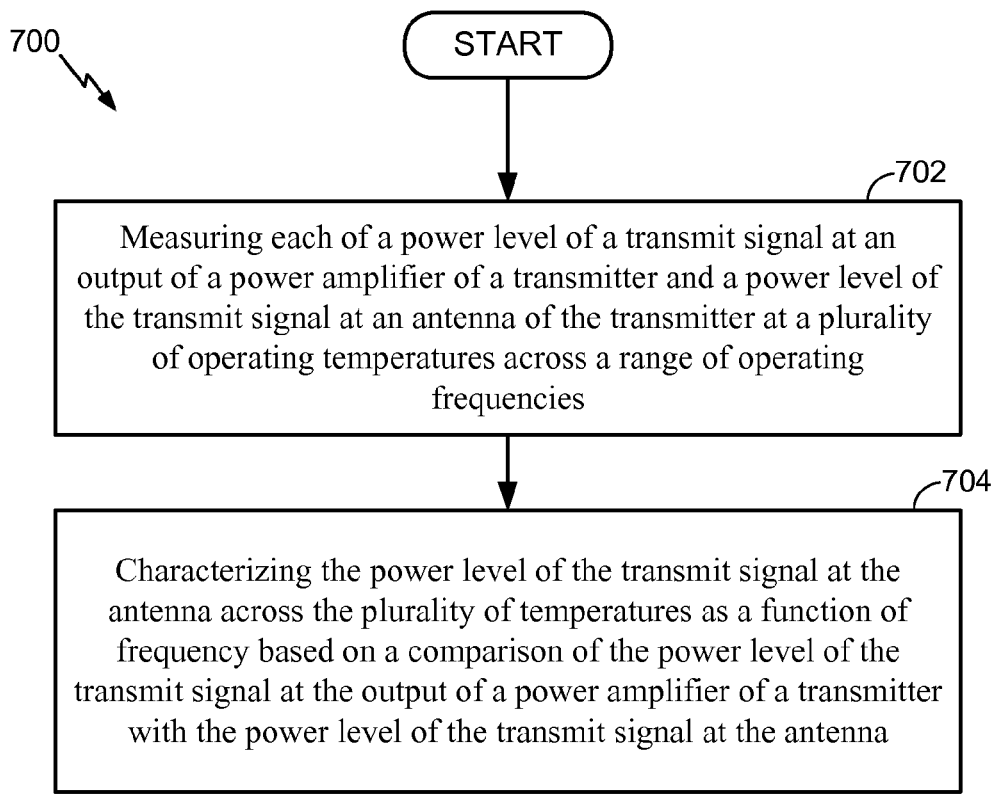
FIG. 7 is a flowchart illustrating yet another method, according to an exemplary embodiment of the present invention.

FIG. 7 is a flowchart illustrating another method 700, in accordance with one or more exemplary embodiments. Method 700 may include measuring each of a power level of a transmit signal at an output of a power amplifier of a transmitter and a power level of the transmit signal at an antenna of the transmitter at a plurality of operating temperatures across a range of operating frequencies (depicted by numeral 702). Method 700 may also include characterizing the power level of the transmit signal at the antenna across the plurality of temperatures as a function of frequency based on a comparison of the power level of the transmit signal at the output of a power amplifier of a transmitter with the power level of the transmit signal at the antenna (depicted by numeral 704).

Figure 8:
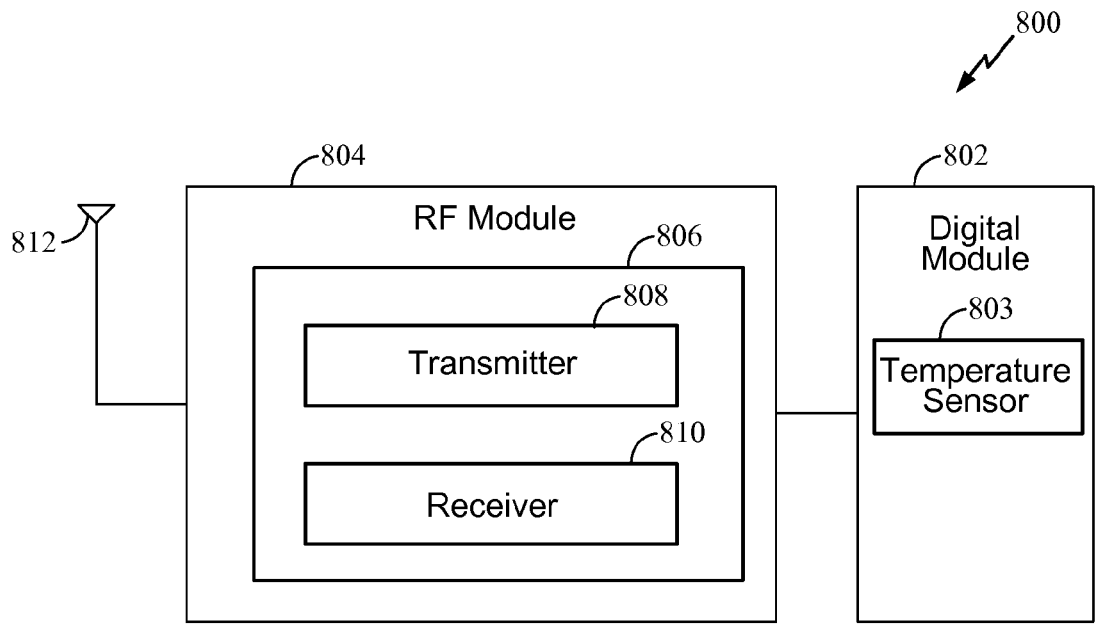
FIG. 8 illustrates a device including a transmitter, in accordance with an exemplary embodiment of the present invention.

FIG. 8 is a block diagram of a device 800, according to an exemplary embodiment of the present invention. According to one example, device 800 may include a wireless communication device. In this example, wireless communication device 800 includes one or more modules, such as a digital module 802 and an RF module 804. Digital module 804 may comprise memory and one or more processors. Further, according to one exemplary embodiment, digital module 804 may include a temperature sensor 803, which may be configured to sense an operating temperature of device 800. RF module 806, which may comprise a radio-frequency integrated circuit (RFIC), may include a transceiver 806 including a transmitter 808 and a receiver 810 and may be configured for bi-directional wireless communication via an antenna 812. In general, wireless communication device 800 may include any number of transmitters (e.g., LTE transmitters) and any number of receivers for any number of communication systems, any number of frequency bands, and any number of antennas. It is noted that transmitter 808 may comprise one or more of device 100 (see FIG. 1).

The exemplary embodiments described herein may provide for considerable improvement in transmit maximum power accuracy over temperature and RB allocations near band edges. Further, although the present invention can be extended to other technologies, it is beneficial to LTE because of the very narrow RB allocations at the band edge. Therefore, since very tight LTE transmit maximum power accuracy is highly desired by OEMs (i.e., for various reasons related to thermal mitigation, SAR back-off, etc over temperature and across various channels, bandwidths and RB allocations), the present invention further addresses the very challenging case of single RB allocations near the band edge over extreme temperatures.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the exemplary embodiments shown herein but is to be accorded the widest scope consistent with the principles and novel features disclosed herein.

What is claimed is:

1. A method, comprising:
    calibrating an output power level of a transmitter transmitting a signal across a range of frequencies at a constant temperature; and
    characterizing the output power level of the transmitter for each temperature of a plurality of temperatures for each frequency of the range of frequencies, wherein calibrating the output power level comprises comparing a power level of a signal at an antenna with a power level of a signal conveyed from a coupler to a power detector in the transmitter at each frequency of the range of frequencies at the constant temperature.

2. A method, comprising:
    calibrating an output power level of a transmitter transmitting a signal across a range of frequencies at a constant temperature; and
    characterizing the output power level of the transmitter for each temperature of a plurality of temperatures for each frequency of the range of frequencies, wherein characterizing the calibrated output power level comprises comparing a power level of a signal at an antenna coupled to the transmitter with a power level of a signal conveyed from a coupler to a power detector in the transmitter across the range of temperatures for each frequency of the range of frequencies.

3. The method of claim 2, wherein calibrating the output power level comprises comparing a power level at an antenna coupled to the transmitter with a power level at an output of a power amplifier at each frequency of the range of frequencies at the constant temperature.

4. The method of claim 2, wherein characterizing the calibrated output power level comprises comparing a power level at an antenna coupled to the transmitter with a power level at an output of a power amplifier across the range of temperatures each frequency of the range of frequencies.

5. A method, comprising:
    calibrating an output power level of a transmitter transmitting a signal across a range of frequencies at a constant temperature; and
    characterizing the output power level of the transmitter for each temperature of a plurality of temperatures for each frequency of the range of frequencies, further comprising storing a power level value for each temperature of the range of temperatures and each frequency of the range of frequencies within a two-dimensional quantized array.

6. The method of claim 5, further comprising adjusting the output power level of the signal generated by the transmitter based on the power level value corresponding to current operating frequency and a current operating temperature.

7. The method of claim 6, wherein adjusting a power level of a signal generated by the transmitter comprises adjusting a power level of a signal generated by a driver amplifier of the transmitter.

8. The method of claim 6, wherein characterizing the output power level of the transmitter comprises characterizing the output power level of a long-term evolution (LTE) transmitter.

9. A method, comprising:
characterizing an output power level across a range of temperatures for each frequency of a range of frequencies by comparing a power level of a signal at an antenna coupled to a transmitter with a power level of a signal conveyed from a coupler to a power detector in the transmitter across the range of temperatures for each frequency of the range of frequencies;
amplifying the transmit signal within a transmit path of a transmitter operating at a known frequency and a known temperature; and
regulating the power level of the transmit signal at the antenna of the transmitter based on the known frequency and the known temperature.

10. The method of claim 9, the regulating comprising regulating the power level of the transmit signal at the antenna of the transmitter based on a pre-determined relationship between a desired power level of the transmit signal at the antenna and a measured power level of the amplified transmit signal across a range of frequencies and a range of temperatures.

11. The method of claim 9, further comprising storing adjustment power levels for each frequency temperature combination of a range of frequencies and a range of temperatures.

12. The method of claim 9, further comprising calibrating an output power level of a transmitter across a range of frequencies at a constant temperature.

13. A method, comprising:
measuring each of a power level of a transmit signal at an output of a power amplifier of a transmitter and a power level of the transmit signal at an antenna of the transmitter at a plurality of operating temperatures across a range of operating frequencies; and
characterizing the power level of the transmit signal at the antenna across the plurality of temperatures as a function of frequency based on a comparison of the power level of the transmit signal at the output of a power amplifier of a transmitter with the power level of the transmit signal at the antenna across the range of temperatures for each frequency of the range of frequencies.

14. The method of claim 13, further comprising storing a power level value for each temperature of the plurality at each frequency of the range of frequencies.

15. The method of claim 14, further comprising adjusting a power level of a generated transmit signal based a stored power level for a current operating temperature and a current operating frequency.

16. The method of claim 13, further comprising calibrating the power level of the transmit signal across the range of operating frequencies at a constant temperature.

17. A device, comprising:
an integrated circuit for conveying a transmit signal; and
a power amplifier coupled to the integrated circuit and configured for conveying the transmit signal to antenna, wherein the integrated circuit is configured to adjust a power level of the transmit signal conveyed by the integrated circuit based on characterizing an output power level across a range of temperatures for each frequency of a range of frequencies by comparing a power level of a signal at an antenna coupled to a transmitter with a power level of a signal conveyed from a coupler to a power detector in the transmitter across the range of temperatures for each frequency of the range of frequencies.

18. The device of claim 17, further comprising an integrated circuit coupled to an input of the power amplifier and configured to adjust the power level of the transmit antenna based on the desired power level and the operational frequency and operational temperature.

19. The device of claim 17, further comprising at least one of a duplexer and a filter coupled between the power amplifier and the antenna.

20. A transceiver, comprising:
a transmitter comprising:
a driver amplifier; and
a power amplifier coupled between the driver amplifier and an antenna;
wherein the transmitter is configured to convey a transmit signal to the power amplifier at a power level based on characterizing an output power level across a range of temperatures for each frequency of a range of frequencies by comparing a power level of a signal at an antenna coupled to a transmitter with a power level of a signal conveyed from a coupler to a power detector in the transmitter across the range of temperatures for each frequency of the range of frequencies.

21. The transceiver of claim 20, the transmitter comprising a long-term evolution (LTE) transmitter.

22. A device, comprising:
means for calibrating an output power level of a transmitter transmitting a signal across a range of frequencies at a constant temperature; and
means for characterizing the output power level of the transmitter across a range of temperatures for each frequency of the range of frequencies, wherein characterizing the output power level comprises comparing a power level of a signal at an antenna with a power level of a signal conveyed from a coupler to a power detector in the transmitter across the range of temperatures for each frequency of the range of frequencies.

23. A device, comprising:
means for measuring each of a power level of a transmit signal at an output of a power amplifier of a transmitter and a power level of the transmit signal at an antenna of the transmitter at a plurality of operating frequencies and a plurality of operating temperature; and
means for characterizing the power level of the transmit signal at the antenna across the plurality of temperatures as a function of frequency based on a comparison of the power level of the transmit signal at the output of a power amplifier of a transmitter with the power level of the transmit signal at the antenna across the range of temperatures for each frequency of the range of frequencies.

* * * * *